United States Patent
Kasai et al.

(10) Patent No.: US 8,803,257 B2
(45) Date of Patent: Aug. 12, 2014

(54) CAPACITIVE VIBRATION SENSOR

(75) Inventors: Takashi Kasai, Kusatsu (JP); Nobuyuki Iida, Hikone (JP); Hidetoshi Nishio, Takatsuki (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 13/060,075

(22) PCT Filed: Feb. 20, 2009

(86) PCT No.: PCT/JP2009/000727
§ 371 (c)(1),
(2), (4) Date: Feb. 22, 2011

(87) PCT Pub. No.: WO2010/023776
PCT Pub. Date: Mar. 4, 2010

(65) Prior Publication Data
US 2011/0140213 A1    Jun. 16, 2011

(30) Foreign Application Priority Data
Aug. 27, 2008    (JP) .................. 2008-218149

(51) Int. Cl.
*H01L 29/84*    (2006.01)

(52) U.S. Cl.
USPC ....... 257/415; 257/417; 257/419; 257/29.324

(58) Field of Classification Search
USPC ............ 257/416, E29.324, 72, 415, 417, 419
See application file for complete search history.

(56) References Cited

U.S. PATENT DOCUMENTS

2006/0087716 A1 * 4/2006 Kweon et al. ............... 359/290
2007/0045757 A1 * 3/2007 Matsubara et al. .......... 257/416

FOREIGN PATENT DOCUMENTS

| CN | 1924533 A | 3/2007 |
| JP | 2002-209298 A | 7/2002 |
| JP | 2006-121465 A | 5/2006 |
| JP | 2007-116721 A | 5/2007 |
| WO | 02/15636 A2 | 2/2002 |

OTHER PUBLICATIONS

International Search Report issued in PCT/JP2009/000727, mailed on Jun. 16, 2009, w/translation, 7 pages.
Chinese Office Action for Application No. 2009801319295, mailed on Jan. 23, 2013 (9 pages).

* cited by examiner

*Primary Examiner* — Lynne Gurley
*Assistant Examiner* — Vernon P Webb
(74) *Attorney, Agent, or Firm* — Osha Liang LLP

(57)    ABSTRACT

A hollow part is formed in a silicon substrate through the front and the back. A vibration electrode plate is arranged on an upper surface of the silicon substrate to cover the opening on the upper surface. A fixed electrode plate covers the upper side of the vibration electrode plate while maintaining a microscopic gap with the vibration electrode plate, where the peripheral part is fixed to the upper surface of the silicon substrate. The fixed electrode plate has the portion facing the upper surface of the silicon substrate through a space supported by a side wall portion arranged on an inner edge of the portion fixed to the upper surface of the silicon substrate without interposing a space. The outer surface of the side wall portion of the fixed electrode plate is covered by a reinforcement film made of metal such as Au, Cr, and Pt.

13 Claims, 14 Drawing Sheets

Fig. 3A
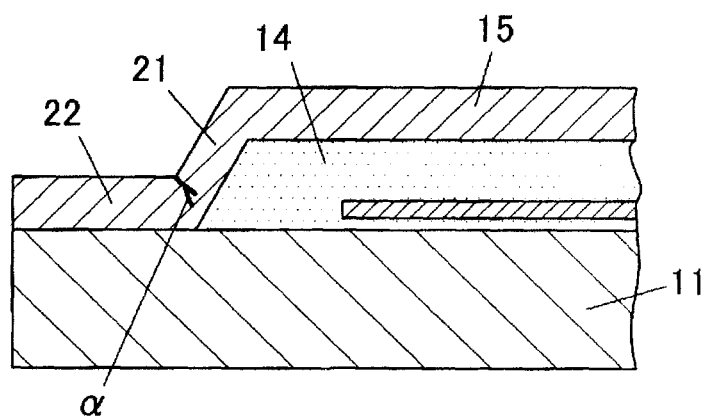
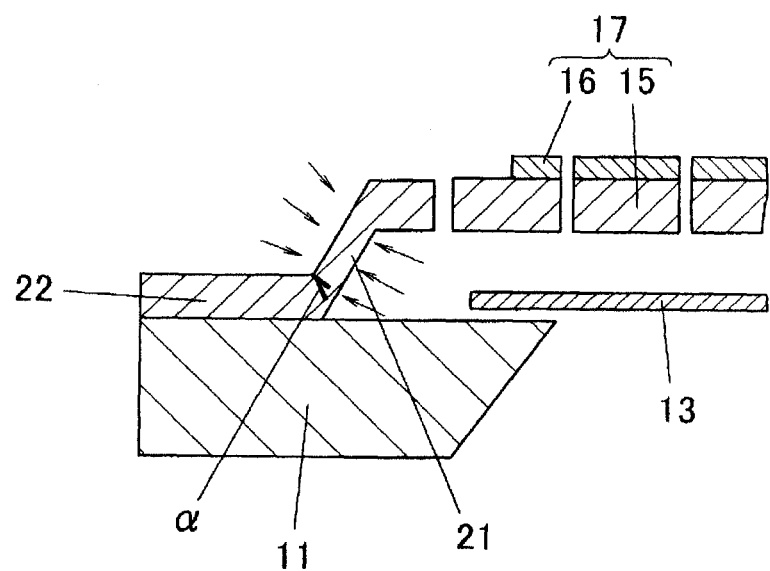
Fig. 3B

Fig. 7A
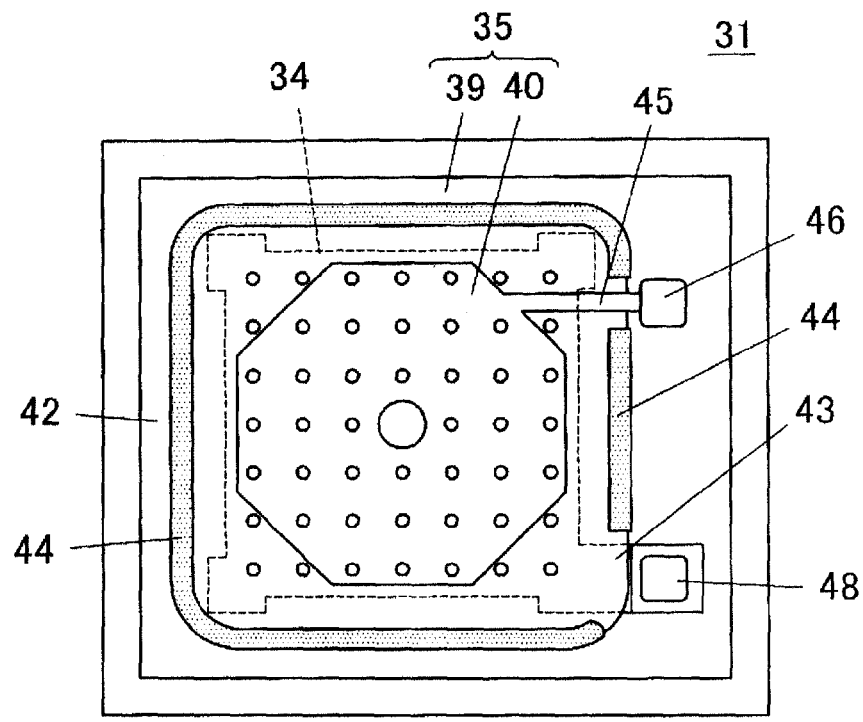
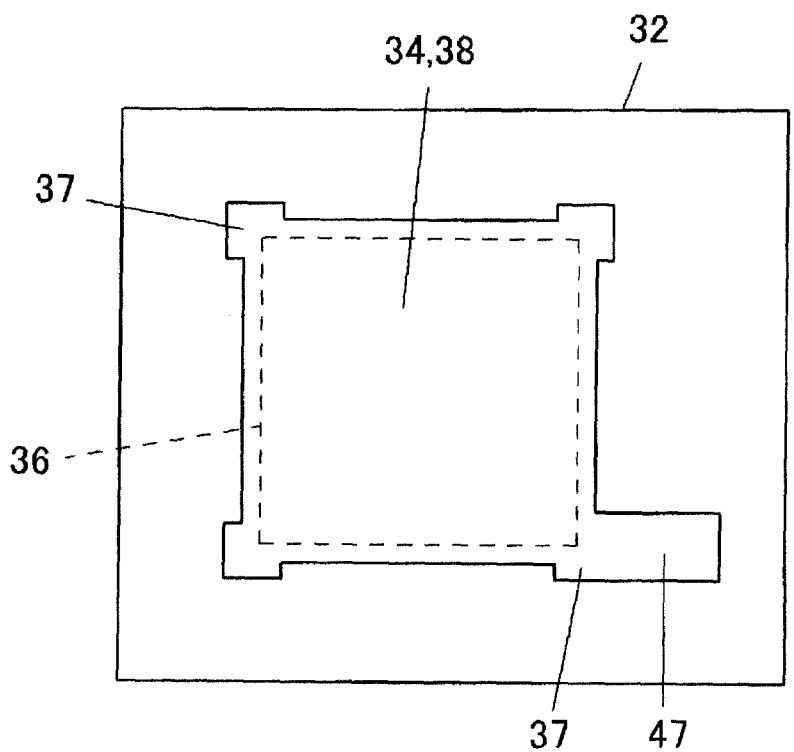
Fig. 7B

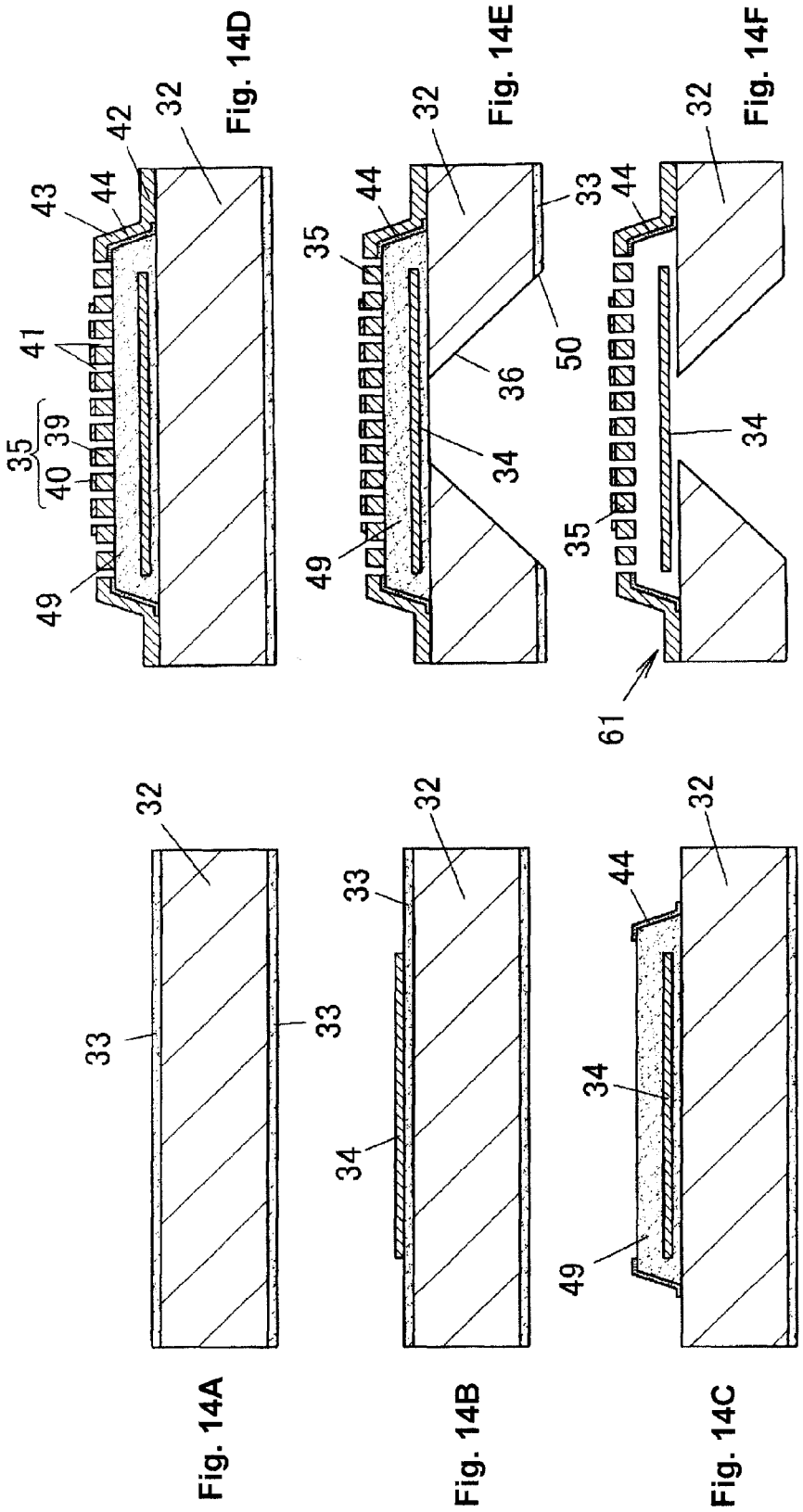

CAPACITIVE VIBRATION SENSOR

BACKGROUND OF INVENTION

1. Technical Field

One or more embodiments of the present invention relate to capacitive sensors, and in particular, to a capacitive sensor of a microscopic size manufactured using an MEMS (Micro Electro Mechanical System) technique or a micromachining technique.

2. Background Art (Manufacturing Method)

A capacitive sensor of a microscopic size is manufactured using an MEMS technique or a micromachining technique, as mentioned above. For example, the conventional capacitive vibration sensor (microphone) is manufactured through steps as shown in FIGS. 1A to 1F. The steps will be briefly described below.

First, as shown in FIG. 1A, surfaces of a Si substrate 11 are oxidized through a thermal oxidation method, and the surfaces of the Si substrate 11 is protected with a thermally oxidized film ($SiO_2$ film) 12. Then, as shown in FIG. 1B, a vibration electrode plate 13 (movable electrode plate) is formed by a polysilicon film on the thermally oxidized film 12 at an upper surface of the Si substrate 11. As shown in FIG. 1C, a sacrifice layer 14 made of $SiO_2$ is deposited on the upper surface of the Si substrate 11 from above the vibration electrode plate 13, and the sacrifice layer 14 is etched to form a mesa type sacrifice layer 14. Furthermore, a back plate 15 is formed by depositing SiN on the upper surface of the Si substrate 11 from above the sacrifice layer 14, and then a fixed electrode 16 made of metal thin film is formed on the back plate 15 to form a fixed electrode plate 17 including the back plate 15 and the fixed electrode 16. Subsequently, as shown in FIG. 1D, a plurality of acoustic perforations 18 is opened in the fixed electrode plate 17 by etching.

Thereafter, as shown in FIG. 1E, a window 19 is opened in that thermally oxidized film 12 on the back surface side, and the Si substrate 11 is anisotropically etched from the window 19 to form a hollow part 20. The hollow part 20 is reached up to the upper surface of the Si substrate 11 to pass the hollow part 20 through the Si substrate 11. Then, as shown in FIG. 1F, the sacrifice layer 14 is removed by etching through the hollow part 20 and the acoustic perforation 18, and a vibration electrode plate 13 that can vibrate is arranged in a space between the Si substrate 11 and the fixed electrode plate 17 to obtain a chip-shaped vibration sensor 23.

FIG. 2(a) is a schematic plan view of a vibration sensor 23 manufactured as mentioned above, and FIG. 2(b) is a plan view showing a state in which the vibration electrode plate 13 is exposed by removing the fixed electrode plate 17. The reference numeral 24 indicates an electrode pad electrically conducted with the fixed electrode 16 of the fixed electrode plate 17, and the reference numeral 25 indicates an electrode pad electrically conducted with the vibration electrode plate 13. The vibration electrode plate 13 has the four corner portions formed as a supporting leg 26 fixed to the Si substrate 11.

However, in the conventional vibration sensor 23, the strength near a fixed portion of the back plate 15, in particular, the strength of a side wall portion raised from the end of the fixed portion easily lowers because it is formed as shown in FIGS. 1A to 1F. FIGS. 3A and 3B are views for describing the reason the strength of the side wall portion lowers in the manufacturing steps of the vibration sensor.

FIG. 3A is a partially enlarged cross-sectional view of a state in which SiN is deposited on the mesa type sacrifice layer 14 to form the back plate 15, and shows the initial step of FIG. 1C. In the deposition step of SiN, the film growth rate becomes greatest in a vertical direction, and thus the film thickness is greatest in a horizontal plane of the back plate 15 and the film thickness becomes thinner than the horizontal plane at the side wall portion 21. Furthermore, the film quality is worse at the side wall portion 21 than the horizontal plane.

In the step of forming the hollow part 20 of FIG. 1E, the hollow part 20 is formed by performing wet etching on the Si substrate 11 with TMAH and KOH solution or performing dry etching using $XeF_2$ gas. In this case, the back plate 15 is also simultaneously etched to some extent and particularly the thickness of the side wall portion 21 tends to be thin.

Furthermore, in the step of removing the sacrifice layer 14 by etching of FIG. 1F, the sacrifice layer 14 is removed by performing wet etching with hydrofluoric acid aqueous solution or performing dry etching using CF gas. In this case, the back plate 15 is also simultaneously etched to some extent and particularly the thickness of the side wall portion 21 tends to be thin.

Thus, as a result of etching the back plate 15 as indicated by arrows in FIG. 3B, the thickness of the side wall portion 21 becomes thin and the film quality thereof also degrades, whereby the strength of the side wall portion 21 of the back plate 15 becomes lower than other areas. Furthermore, as shown in FIG. 3B, a crack α tends to easily form at the boundary of the fixed portion 22 and the side wall portion 21 of the back plate 15 at the time of forming the back plate 15 and at the time of etching the Si substrate 11 and the sacrifice layer 14.

Thus, the stress has no place to escape when impact is externally applied to the vibration sensor 23, whereby the stress concentrates at the side wall portion 21 of the back plate 15 and the boundary of the side wall portion 21 and the fixed portion 22, thereby forming the crack in the back plate 15 and breaking the same.

The strength of the back plate 15 can be increased by increasing the film thickness at the time of forming the back plate 15, but the productivity of the vibration sensor 23 worsens because the film forming time becomes longer and the processing accuracy of the back plate lowers with such a countermeasure method, and thus it is not practical.

(Disclosure in Patent Document 1)

Patent Document 1 discloses a sensor in which the rigidity of the back plate (thin film plate of silicon nitride) is increased by forming the side wall portion of the back plate as a rib structure thereby preventing the warp of the back plate. In such a structure, the rib structure is formed at the side wall portion of the back plate, and thus the strength of the side wall portion appears to have increased.

However, as in the above structure, the side wall portion having the rib structure cannot prevent the etching of the back plate when etching the substrate and the sacrifice layer and cannot make the film quality of the side wall portion satisfactory when forming the back plate. Therefore, it is not effective in enhancing the strength of the side wall portion.

If the side wall portion has a rib structure, the stress rather tends to easily concentrate at the rib when impact is externally applied, thereby forming cracks at the side wall portion, the base portion thereof, and the like and breaking the same.

Patent Document 1: Japanese Unexamined Patent Publication No. 2007-116721 (FIG. 13, FIG. 14)

SUMMARY OF INVENTION

One or more embodiments of the present invention provide a capacitive sensor capable of enhancing the strength of a fixed electrode plate positioned on the outer side of a movable electrode plate and the fixed electrode plate configuring a capacitor, and increasing impact resistance and breakage resistance.

A capacitive sensor of one or more embodiments of the present invention includes a substrate, a movable electrode plate arranged on an upper surface of the substrate, and a fixed electrode plate arranged on the upper surface of the substrate so as to cover the movable electrode plate, a physical amount or change thereof being detected by a capacitance or a change thereof between the movable electrode plate and the fixed electrode plate, wherein the fixed electrode plate has a portion facing the upper surface of the substrate through a space supported by a side wall portion arranged on an inner edge of a portion fixed to the upper surface of the substrate without interposing a space, and a reinforcement film is formed on at least one part of the side wall portion.

In the capacitive sensor of one or more embodiments of the present invention, the strength of the side wall portion of the fixed electrode plate can be enhanced by the reinforcement film because the reinforcement film is formed on the side wall portion positioned on the inner edge of the region fixed to the substrate of the fixed electrode plate. When etching the substrate and the like in the manufacturing steps of the capacitive sensor, the fixed electrode plate is prevented from being etched with the substrate and the like in the region covered with the reinforcement film so that the thickness can be suppressed from becoming thin. Thus, in one or more embodiments of the present invention, the fixed electrode plate can be prevented from breaking by external impact etc., and the impact resistance and the breakage resistance of the capacitive sensor can be enhanced.

In an aspect of the capacitive sensor of one or more embodiments of the present invention, the reinforcement film is made of metal, and the reinforcement film is electrically insulated with both the movable electrode plate and the fixed electrode plate. According to such an aspect, the reinforcement film can be simultaneously formed when forming the fixed electrode plate and other electrodes because the reinforcement film is made of metal, whereby the manufacturing steps of the capacitive sensor can be simplified. Furthermore, even if cracks occur in the fixed electrode plate at the time of forming the fixed electrode plate, the metal with plasticity as the material of the reinforcement film enters into the crack and fills the crack when the reinforcement film is formed on the fixed electrode plate, and hence the cracks can be restored to a certain extent. Moreover, the capacitance between the fixed electrode plate and the movable electrode plate is not adversely affected by forming the reinforcement film because the reinforcement film made of metal is not electrically conducted with the fixed electrode plate and the movable electrode plate.

The reinforcement film is desirably formed by at least one material selected from Au, Cr, and Pt. Because Au, Cr, Pt has chemical resistance, the reinforcement film is less likely to be etched and to become thin in the etching step (e.g., etching step of substrate and sacrifice layer) after forming the reinforcement film by forming the reinforcement film with Au, Cr, Pt, and hence the strength of the reinforcement film is less likely to lower.

The reinforcement film desirably does not overlap either an electrically conductive region of the movable electrode plate and an electrically conductive region of the fixed electrode plate. Because the reinforcement film made of metal does not overlap the electrically conductive region of the movable electrode plate and the electrically conductive region of the fixed electrode plate, parasitic capacitance is less likely to occur between the reinforcement film and the movable electrode plate and between the reinforcement film and the fixed electrode plate, whereby the lowering in sensitivity of the capacitive sensor due to parasitic capacitance can be suppressed.

Another aspect of the capacitive sensor of one or more embodiments of the present invention includes arranging the reinforcement film on the outer surface of the side wall portion. Because the fixed electrode plate often has the outer peripheral part fixed to the substrate and the cracks and breakage of the fixed electrode plate tend to easily occur at the side wall portion of the fixed electrode plate, the cracks and breakage of the fixed electrode plate can be effectively prevented by arranging the reinforcement film on the outer surface of the side wall portion according to this aspect. Furthermore, the reinforcement film can be formed at the same time as the fixed electrode of the fixed electrode plate because the reinforcement film is arranged on the outer surface of the fixed electrode plate, whereby the manufacturing steps of the capacitive sensor can be simplified.

Still another aspect of the capacitive sensor of one or more embodiments of the present invention includes arranging the reinforcement film on the inner surface of the side wall portion. As the fixed electrode plate often has the outer peripheral part fixed to the substrate and the cracks and breakage of the fixed electrode plate tend to easily occur at the side wall portion of the fixed electrode plate, the cracks and breakage of the fixed electrode plate can be effectively prevented by arranging the reinforcement film on the inner surface of the side wall portion according to this aspect.

The reinforcement film is desirably formed entirely excluding a region for insulation adjacent to the region that does not overlap either the electrically conductive region of the movable electrode plate and the electrically conductive region of the fixed electrode plate on at least one of an outer surface and an inner surface of the side wall portion. The reinforcement film is desirably arranged at an area as wide as possible so as not to conduct with the fixed electrode plate and the movable electrode plate and so as not to overlap the electrically conductive region of the fixed electrode plate and the electrically conductive region of the movable electrode plate, whereby the strength of the side wall portion can be increased as much as possible.

The means in one or more embodiments of the present invention may appropriately combine the configuring elements described above. One or embodiments of the present invention enable a great number of variations from the combinations of the configuring elements.

BRIEF DESCRIPTION OF THE DRAWINGS

FIGS. 3A and 3B are views for describing the reason the strength of the fixed electrode plate lowers in the manufacturing steps of the vibration sensor.

FIG. 7A is a plan view schematically showing a vibration sensor of the first embodiment. FIG. 7B is a schematic plan view showing a state in which a fixed electrode plate is removed from the vibration sensor of FIG. 7A to expose the vibration electrode plate.

FIGS. 14A to 14F are schematic cross-sectional views for describing manufacturing steps of a capacitive vibration sensor of the third embodiment.

DETAILED DESCRIPTION

One or more embodiments of the present invention will be described below with reference to the accompanying drawings. In the following embodiments, a capacitive vibration sensor (particularly, acoustic sensor), which is one type of capacitive sensor, will be described by way of example, but the present invention can be applied other than to the vibration sensor. In embodiments of the invention, numerous specific details are set forth in order to provide a more thorough understanding of the invention. However, it will be apparent to one with ordinary skill in the art that the invention may be practiced without these specific details. In other instances, well-known features have not been described in detail to avoid obscuring the invention.

First Embodiment

Figure 1:
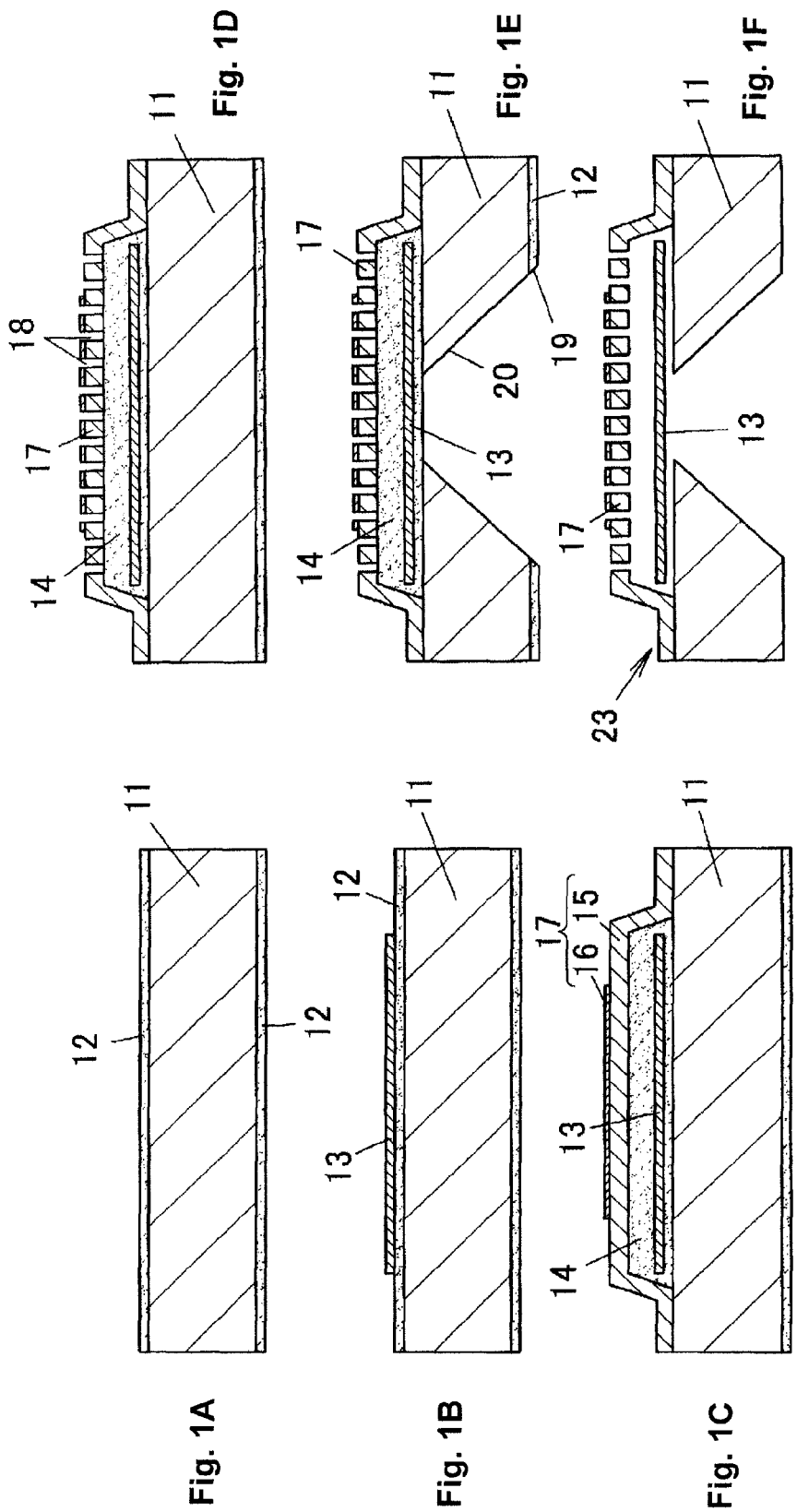
FIGS. 1A to 1F are schematic cross-sectional views for describing manufacturing steps of a conventional capacitive vibration sensor.
Figure 2:
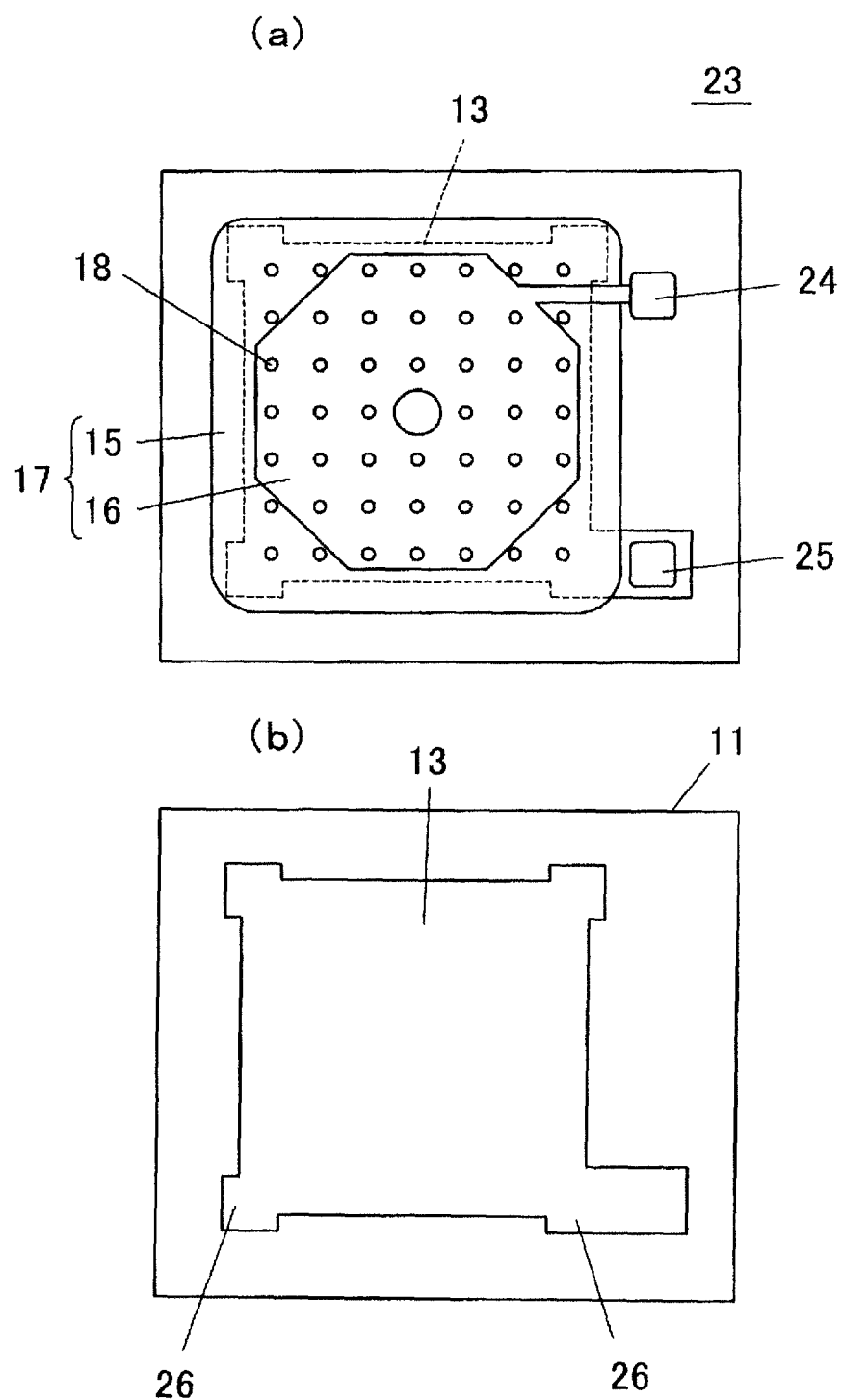
FIG. 2A is a schematic plan view of a vibration sensor manufactured by the steps of FIGS. 1A to 1F.
FIG. 2B is a plan view showing a state in which the vibration electrode plate is exposed by removing the fixed electrode plate from the vibration sensor of FIG. 2A.
Figure 4:
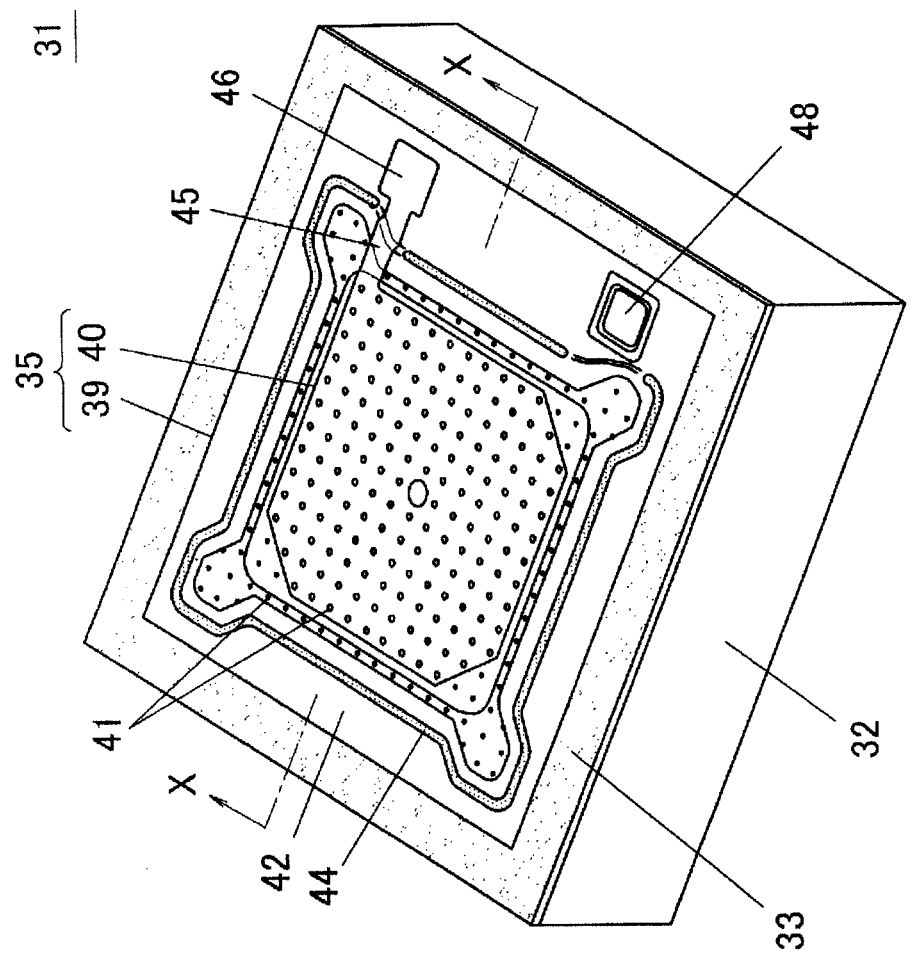
FIG. 4 is a perspective view showing a vibration sensor according to a first embodiment of the present invention.
Figure 5:
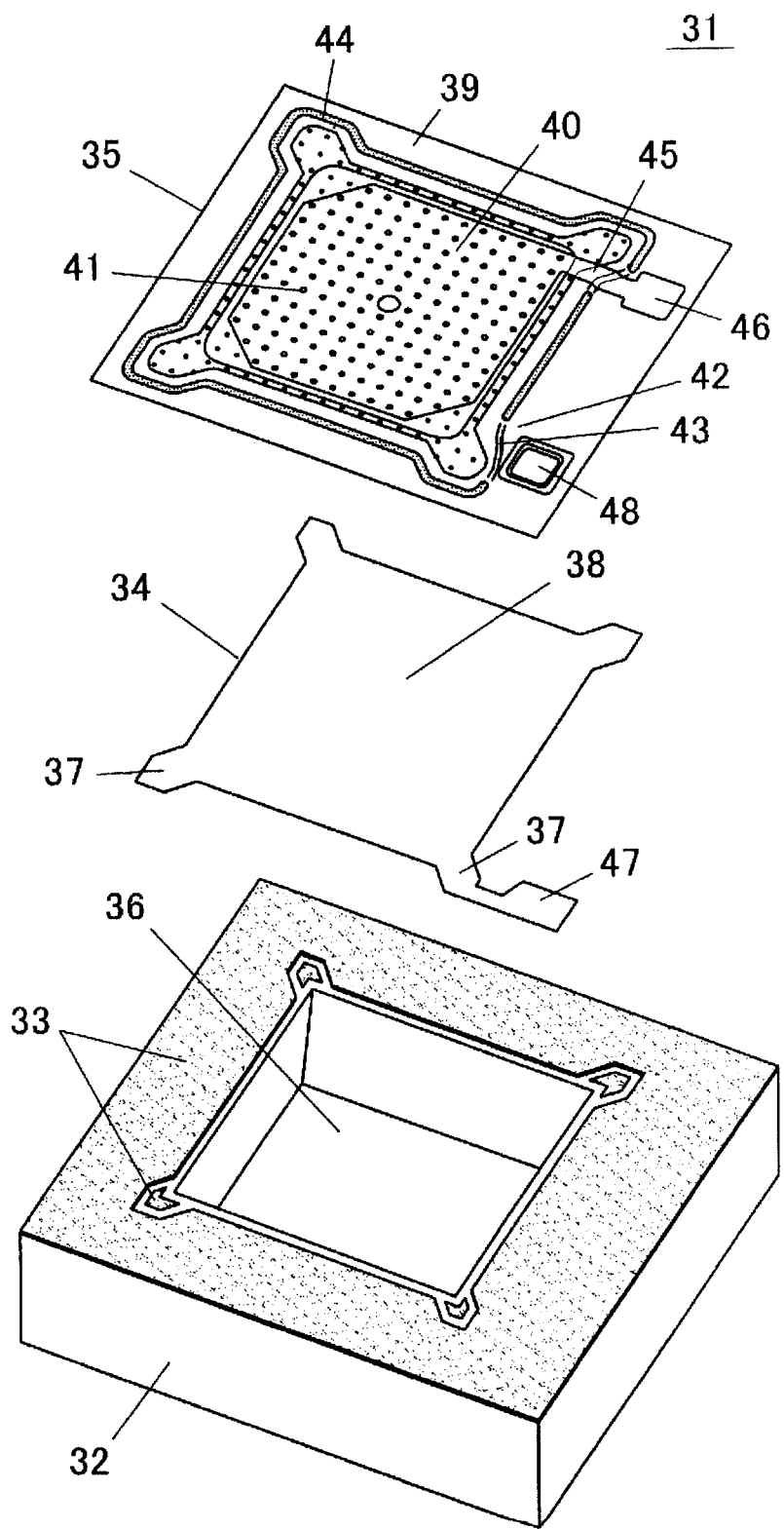
FIG. 5 is an exploded perspective view of the vibration sensor of the first embodiment.
Figure 6:
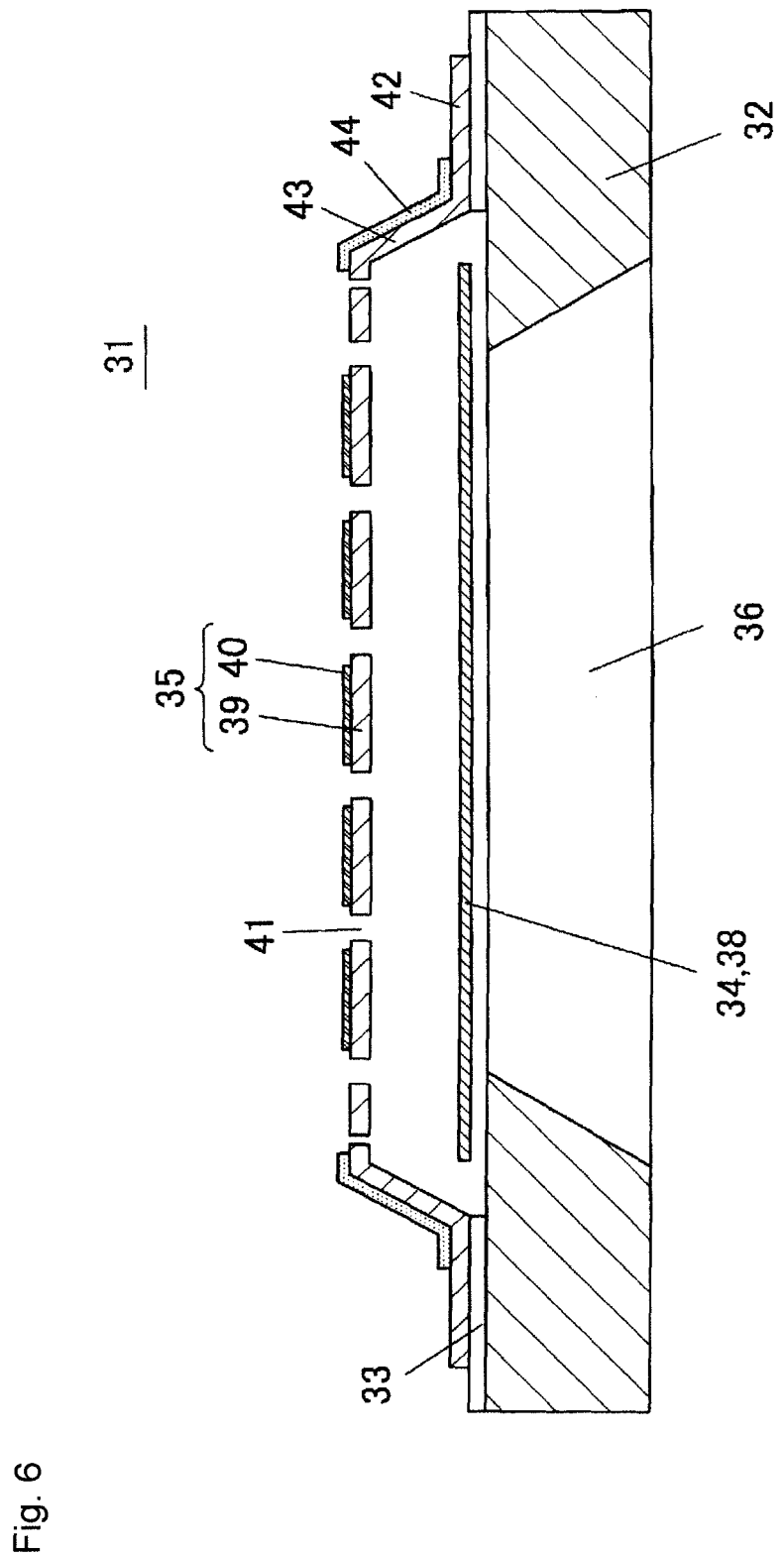
FIG. 6 is a schematic cross-sectional view taken along line X-X of FIG. 4.

A vibration sensor 31 according to a first embodiment of the present invention will be described with reference to FIG. 4 to FIG. 7. FIG. 4 is a perspective view showing the vibration sensor 31 according to the first embodiment, and FIG. 5 is an exploded perspective view thereof. FIG. 6 is a schematic cross-sectional view taken along line X-X of FIG. 4. FIG. 7A is a plan view schematically showing the vibration sensor of the first embodiment. FIG. 7B is a schematic plan view showing a state in which a fixed electrode plate is removed from the vibration sensor of FIG. 7A to expose the vibration electrode plate.

The vibration sensor 31 is a capacitive sensor, where a vibration electrode plate 34 (movable electrode plate) is arranged on an upper surface of a silicon substrate 32 through an insulation coating 33, and a fixed electrode plate 35 is arranged thereon through a microscopic air gap (space).

As shown in FIG. 5, the silicon substrate 32 includes a hollow part 36 including a square column shaped throughhole or a square truncated cone shaped recess (hollow part 36 passing through in an up and down direction is shown in the figure) the size of the silicon substrate 32 is 1 to 1.5 mm angle (may be smaller) in plan view, and the thickness of the silicon substrate 32 is about 400 to 500 μm). The upper surface of the silicon substrate 32 is formed with the insulation coating 33 made of oxide film ($SiO_2$ film) and the like.

The vibration electrode plate 34 is formed by a polysilicon thin film having a film thickness of about 1 μm. The vibration electrode plate 34 is a thin film having a substantially rectangular shape, and supporting legs 37 extend toward the outside in a diagonal direction at the four corners. An extended part 47 is extended from one of the supporting legs 37. The vibration electrode plate 34 is arranged on the upper surface of the silicon substrate 32 so as to cover the upper surface of the hollow part 36, and supporting legs 37 at the four corners and the extended part 47 are fixed on the insulation coating 33. The portion of the vibration electrode plate 34 supported in air at the upper side of the hollow part 36 (portion other than the supporting legs 37 and the extended part 47 in the present embodiment) is a diaphragm 38 (vibration film), and vibrates in response to a sound pressure.

The fixed electrode plate 35 has a fixed electrode 40 including a metal thin film arranged on an upper surface of a back plate 39 including a nitride film. As shown in FIG. 6, the fixed electrode plate 35 covers the diaphragm 38 with a microscopic gap of about 3 μm in the region facing the diaphragm 38, and the fixed electrode 40 configures a capacitor facing the diaphragm 38. The outer peripheral part of the fixed electrode plate 35, that is, the portion on the outer side of the region facing the diaphragm 38 is fixed to the upper surface of the silicon substrate 32 through the insulation coating 33 including an oxide film and the like. Such a fixed portion is hereinafter referred to as a fixed part 42.

A drawing portion 45 is extended from the fixed electrode 40, where an electrode pad 46 (Au film) electrically conducted with the fixed electrode 40 is arranged at the distal end of the drawing portion 45. An electrode pad 48 (Au film) that joins to the extended part 47 of the vibration electrode plate 34 to electrically conduct with the vibration electrode plate 34 is arranged on the fixed electrode plate 35. The electrode plate 46 is arranged on the upper surface of the back plate 39, and the electrode pad 48 is positioned in the opening of the back plate 39. The outer surface of the back plate 39 is covered with a reinforcement film 44 including a metal film at one part of the region along the inner peripheral edge of the fixed part 42.

A plurality of acoustic perforations 41 (acoustic holes) for passing the sound pressure (vibration) is perforated in the fixed electrode 40 and the back plate 39 so as to pass through the upper surface to the lower surface. The vibration electrode plate 34 is a thin film of about 1 μm because it is to vibrate in resonance with the sound pressure, but the fixed electrode plate 35 is an electrode that does not vibrate by the sound pressure, and thus is thick, that is, has a thickness of greater than or equal to 2 μm.

In the vibration sensor 31, when the acoustic vibration (compressional wave of air) enters from the front surface side, the acoustic vibration passes through the acoustic perforations 41 of the fixed electrode plate 35 and reaches the diaphragm 38, thereby vibrating the diaphragm 38. When the diaphragm 38 vibrates, the gap distance between the diaphragm 38 and the fixed electrode plate 35 changes, whereby the capacitance between the diaphragm 38 and the fixed electrode 40 changes. Therefore, the vibration of the sound can be converted to an electric signal for detection by applying a direct current (DC) voltage between the electrode pads 46 and 48, and taking out the change in capacitance as an electric signal.

(Configuration of Reinforcement Film)

FIGS. 7A and 7B show the structure shown in FIG. 4 and FIG. 5 in a simplified manner to facilitate the understanding of the basic structure of the first embodiment. In the following, the configuration of the reinforcement film 44 will be described with reference to FIGS. 7A and 7B in place of FIG. 4 and FIG. 5. A second and third embodiments to be described later will also be described with reference to the similarly simplified figures.

As shown in FIG. 6 and FIG. 7A, the outer peripheral part of the back plate 39, that is, the fixed part 42 is fixed to the upper surface of the silicon substrate 32, where the region on the inner side thereof is floated from the upper surface of the silicon substrate 32 and faced to the vibration electrode plate 34. The space between the upper surface of the back plate 39 floating from the silicon substrate 32 and the fixed part 42 is a side wall portion 43 inclined with respect to the horizontal surface. As described in the background art, the fixed electrode plate 35 has the reinforcement film 44 formed at one part along the side wall portion 43 in the present embodiment because the strength of the side wall portion 43 tends to lower.

The reinforcement film 44 uses a material that is not etched (or with small etching rate) at the time of etching the silicon substrate 32, the sacrifice layer, and the like. The reinforcement film 44 also uses a material that is less likely to break by impact, and thus uses a material having ductility and toughness rather than a brittle material. Therefore, the reinforcement film 44 uses a metal material, and in particular, uses a material that is less likely to be corroded by the etchant such as Au, Cr, and Pt.

The reinforcement film 44 can be simultaneously formed when forming the electrode pads 46, 48 by using the Au film. The Au film is a metal excelling in ductility, and is suited for the reinforcement film 44. Furthermore, the Au film excels in chemical resistance, and is less likely to be corroded by the etchant.

Moreover, the reinforcement film 44 desirably has a two layer structure of upper layer Au film/lower layer Cr film. Because the Cr film excels in adhesiveness with another material, the adhesion force of the Au film and the back plate 39 can be enhanced by using the Cr film for the lower. The Cr film also excels in chemical resistance.

Because the Cr film excels in chemical resistance and adhesiveness with another material, the use of the Cr film alone is also suited for the reinforcement film 44.

The form of the reinforcement film 44 will now be described. As shown in FIG. 6, the reinforcement film 44 extends to the upper surface of the fixed part 42 and the back plate 39. In other words, the bent portion of the upper end and the lower end of the side wall portion 43 where crack is likely to occur at the time of forming the back plate 39 is covered with the reinforcement film 44.

As shown in FIG. 7A, the reinforcement film 44 is arranged at one part of the side wall portion 43 so as not to contact the electrically conductive region (fixed electrode 40, drawing portion 45, electrode pad 46) of the fixed electrode plate 35 and the electrically conductive region (vibration electrode plate 34 itself) of the vibration electrode plate 34, and so as not to overlap the electrically conductive region of the fixed electrode plate 35 and the electrically conductive region of the vibration electrode plate 34. The reinforcement film 44 desirably covers an area as wide as possible of the side wall portion 43 to an extent of not contacting and overlapping the electrically conductive regions of the fixed electrode plate 35 and the vibration electrode plate 34 so that the strength of the side wall portion 43 increases. That is, the reinforcement film 44 is desirably formed entirely excluding the region for insulation adjacent to the region that does not overlap the electrically conductive region of the vibration electrode plate 34 and the electrically conductive region of the fixed electrode plate 35 of the side wall portion 43.

The reason the reinforcement film 44 is arranged so as not to contact nor overlap the electrically conductive region of the fixed electrode plate 35 and the electrically conductive region of the vibration electrode plate 34 will be described in comparison with a comparative example (undesired example) shown in FIG. 8 and FIG. 9. FIG. 9 is a cross-sectional view taken along line Y-Y of FIG. 8.

Figure 8:
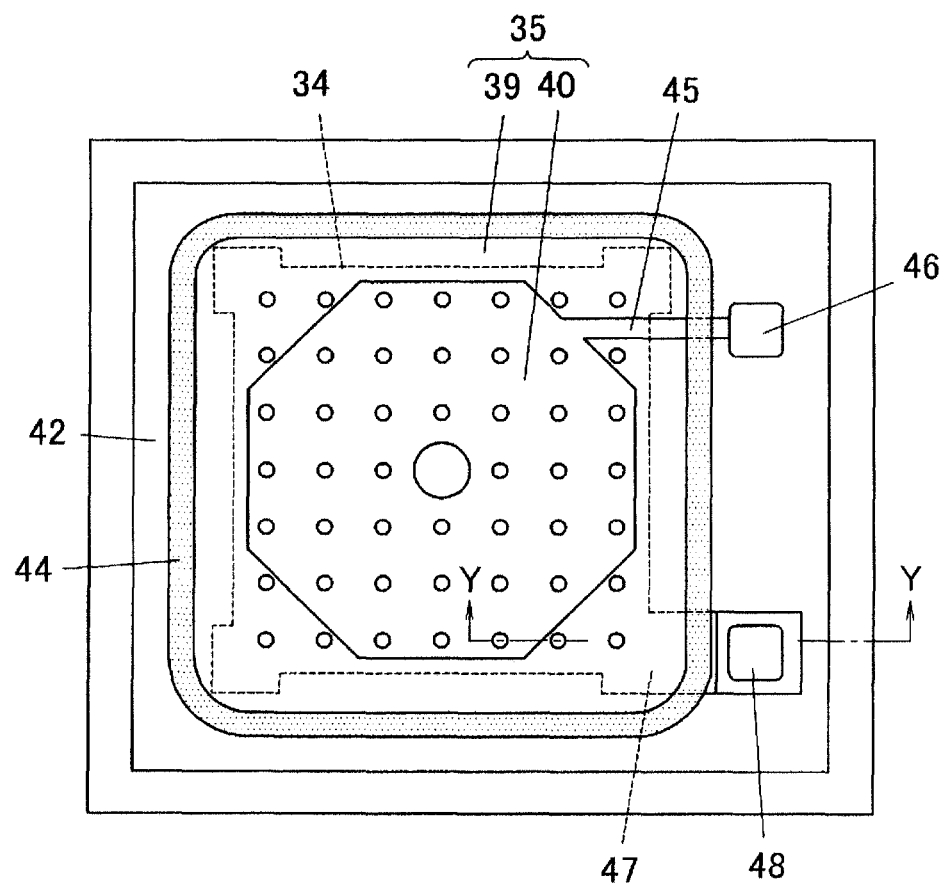
FIG. 8 is a schematic plan view showing a vibration sensor of a comparison example.
Figure 9:
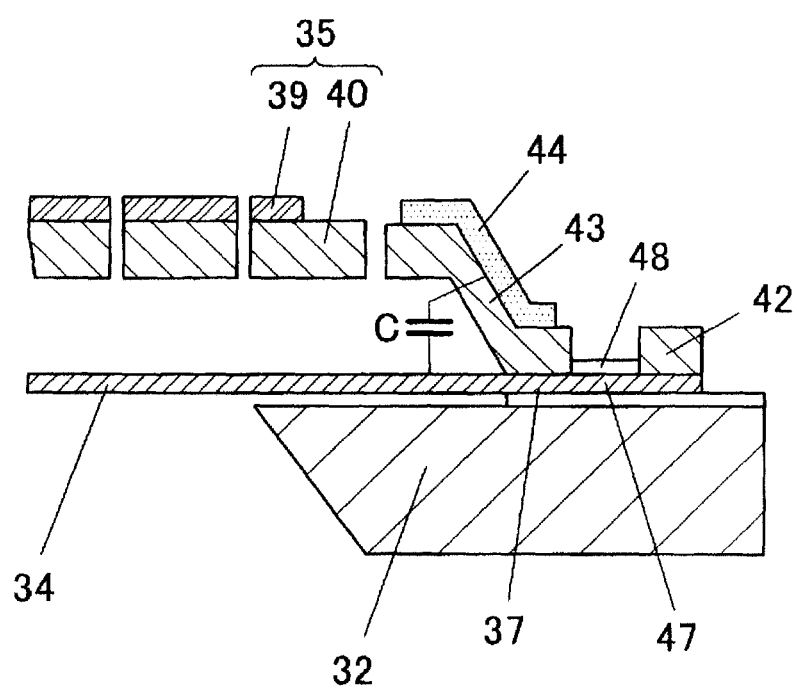
FIG. 9 is a cross-sectional view taken along line Y-Y of FIG. 8.

In the comparison example shown in FIG. 8 and FIG. 9, the reinforcement film 44 is arranged over the entire periphery of the side wall portion 43. As shown in the comparison example, if the reinforcement film 44 made of metal is passed through the drawing portion 45, the reinforcement film 44 contacts the drawing portion 45 thereby conducting the reinforcement film 44 and the fixed electrode plate 35, changing the characteristics of the vibration sensor 31, and lowering the sensitivity.

Furthermore, if the reinforcement film 44 passing the upper side of the extended part 47 runs out to the electrode pad 48 or the electrode pad 48 contacts the reinforcement film 44 due to position shift of the electrode pad 48, the vibration electrode plate 34 and the fixed electrode plate 35 short circuit by the reinforcement film 44, and hence the vibration sensor 31 becomes a defective product.

Even if the reinforcement film 44 does not contact the electrode pad 48, a parasitic capacitance C generates between the reinforcement film 44 and the vibration electrode plate 34, as shown in FIG. 9, if the reinforcement film 44 passes the upper side of the extended part 47, and hence the sensor sensitivity may lower by the parasitic capacitance C.

In the vibration sensor 31 of the present embodiment, on the other hand, the reinforcement film 44 is partially removed so that the reinforcement film 44 does not pass through the electrically conductive region of the vibration electrode plate 34 and the electrically conductive region of the fixed electrode plate 35, whereby drawbacks such as conduction of the reinforcement film 44 and the fixed electrode 40 etc., short circuit of the vibration electrode plate 34 and the fixed electrode plate 35, and generation of parasitic capacitance can be avoided, and the sensitivity and the properties of the vibration sensor 31 can be held satisfactorily.

(Manufacturing Method)

Figure 10:
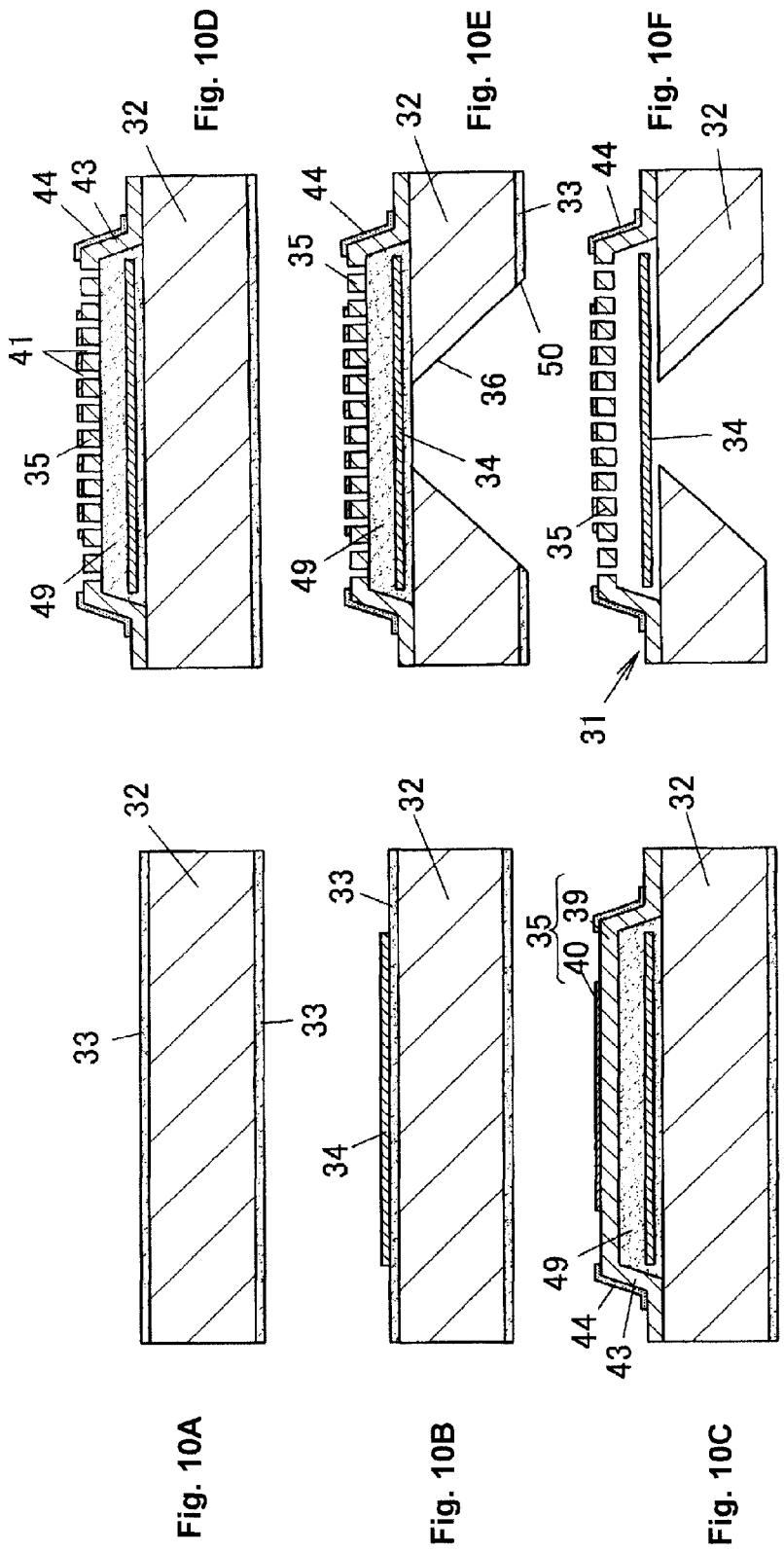
FIGS. 10A to 10F are schematic cross-sectional views for describing manufacturing steps of the capacitive vibration sensor according to the first embodiment.

The manufacturing method of the vibration sensor 31 of the first embodiment will be described by FIGS. 10A to 10F. First, as shown in FIG. 10A, the surface of the silicon substrate 32 is oxidized through thermal oxidation method, and the surface of the silicon substrate 32 is covered with the insulation coating 33 ($SiO_2$ film). Then, as shown in FIG. 10B, the vibration electrode plate 34 is formed by a polysilicon film on the insulation coating 33 at the upper surface of the silicon substrate 32. As shown in FIG. 10C, a sacrifice layer 49 made of $SiO_2$ is deposited on the upper surface of the silicon substrate 32 from above the vibration electrode plate 34, and the sacrifice layer 49 is etched to form a mesa type sacrifice layer 49. Furthermore, a back plate 39 is formed by depositing SiN on the upper surface of the Si substrate 32 from above the sacrifice layer 49, and then a fixed electrode 40 made of metal thin film is formed on the back plate 39 to form a fixed electrode plate 35 including the back plate 39 and the fixed electrode 40. The reinforcement film 44 is formed at the side wall portion 43 of the back plate 39 and the vicinity thereof through the sputtering method and the like. In this case, the fixed electrode 40 and the reinforcement film 44 can be simultaneously formed in one step if the fixed electrode 40 and the reinforcement film 44 are of the same material, whereby the manufacturing step can be simplified.

As shown in FIG. 10D, a plurality of acoustic perforations 41 is opened in the fixed electrode plate 35 by etching. Thereafter, as shown in FIG. 10E, a window 50 is opened in the insulation coating 33 on the rear surface side, and the hollow part 36 is formed by anisotropically etching the silicon substrate 32 from the window 50. The hollow part 36 is then reached up to the upper surface of the silicon substrate 32 to penetrate the hollow part 36 in the silicon substrate 32. Then, as shown in FIG. 10F, the sacrifice layer 49 is removed by etching through the hollow part 36 and the acoustic perforation 41, and the vibration electrode plate 34 the can vibrate is arranged in a space between the silicon substrate 32 and the fixed electrode plate 35 to obtain a chip-shaped vibration sensor 31.

(Effects)

In the vibration sensor 31 of the present embodiment, the back plate 39 (especially, side wall portion 43 which strength easily lowers in the manufacturing step) can be reinforced by the reinforcement film 44 according to the above described structure. In the step of opening the hollow part 36 in the silicon substrate 32 or in the step of removing the sacrifice layer 49 by etching, the side wall portion 43 can be prevented from being corroded by etching and the thickness from being thinned by covering the side wall portion 43 with the reinforcement film 44 having etching resistance property. Furthermore, although the crack sometimes forms in the side wall portion 43 of the back plate 39 in the step of forming the back plate 39, the crack can be filled and restored with the metal of the reinforcement film 44 by forming the reinforcement film 44 made of metal which is the plastic material in the side wall portion 43. The mechanical strength of the back plate 39 thus can be enhanced by the reinforcement film 44, and hence the impact resistance and the breakage resistance of the vibration sensor 31 are enhanced and the durability and the lifespan of the vibration sensor 31 are enhanced.

Second Embodiment

Figure 11:
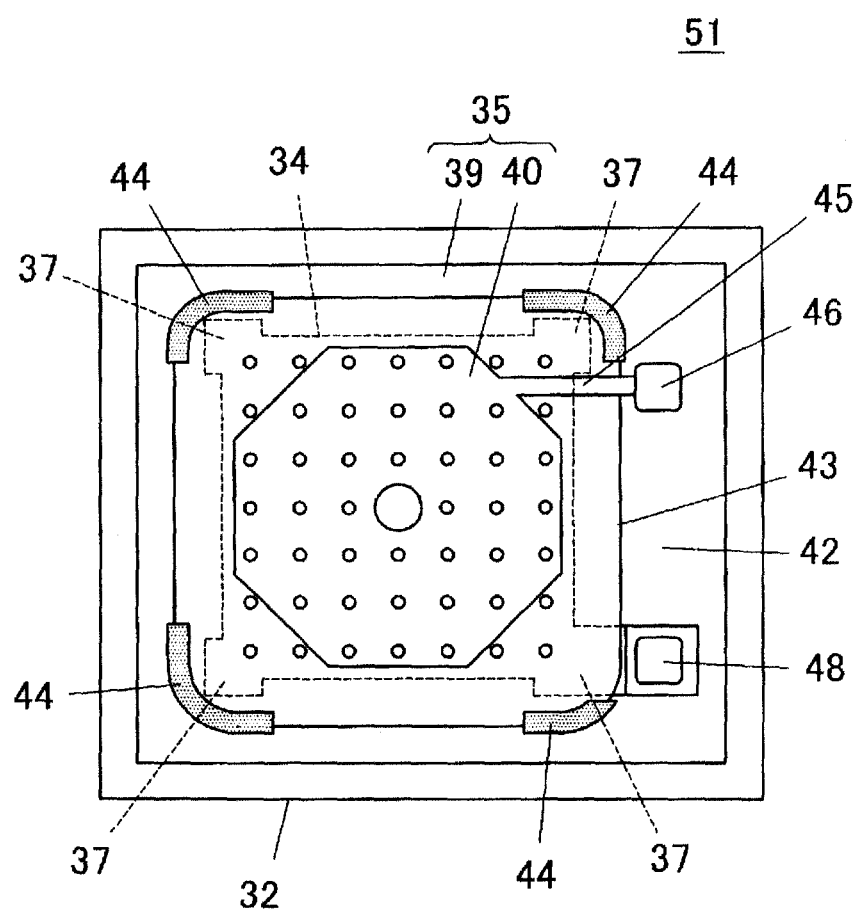
FIG. 11 is a plan view schematically showing a vibration sensor according to a second embodiment of the present invention.

FIG. 11 is a schematic plan view showing a vibration sensor 51 according to a second embodiment of the present invention. In the present embodiment, the reinforcement films 44 are arranged only in the regions corresponding to the four corners of the side wall portion 43 in plan view of the side wall portion 43 of the back plate 39 and the region in the vicinity thereto.

FIG. 11 is a view schematically showing the vibration sensor 51, where the four corners of the side wall portion 43 are actually expanded toward the outside in the diagonal direction in accordance with the supporting legs 37 of the vibration electrode plate 34, as apparent from FIG. 4 and FIG. 5 which are the detailed figures of the first embodiment. Thus, the four corners are the portions where the strength tends to lower in particular of the side wall portion 43. Thus, the second embodiment is an embodiment in which the reinforcement film 44 is formed in a minimum region of the side wall portion 43 where the strength tends to be lowest.

Third Embodiment

Figure 12:
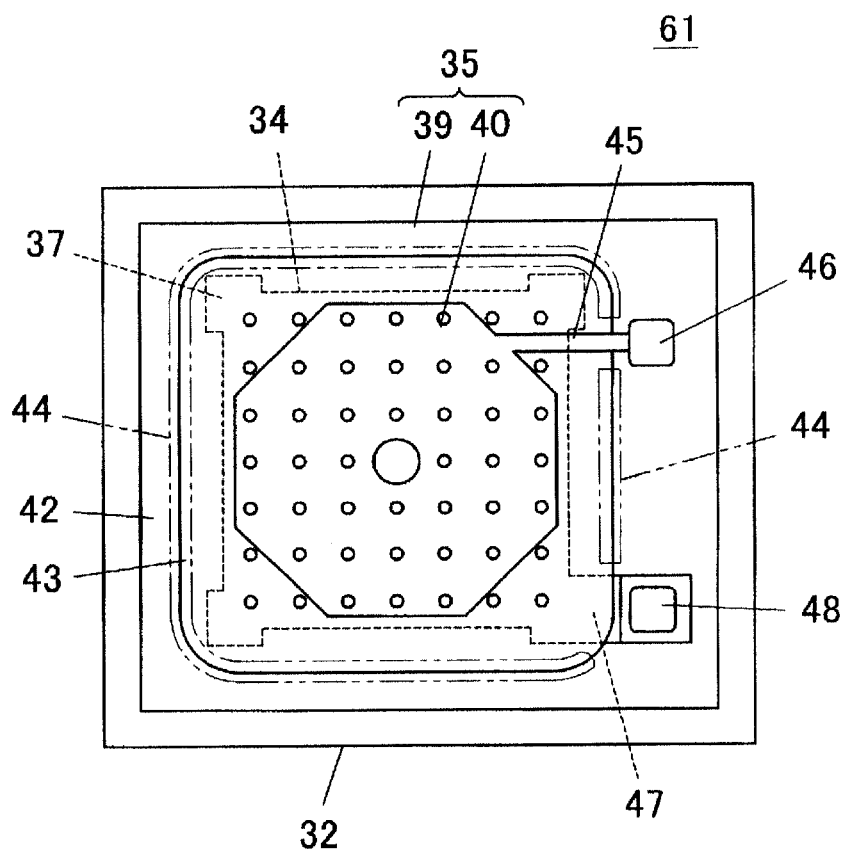
FIG. 12 is a plan view schematically showing a vibration sensor according to a third embodiment of the present invention.
Figure 13:
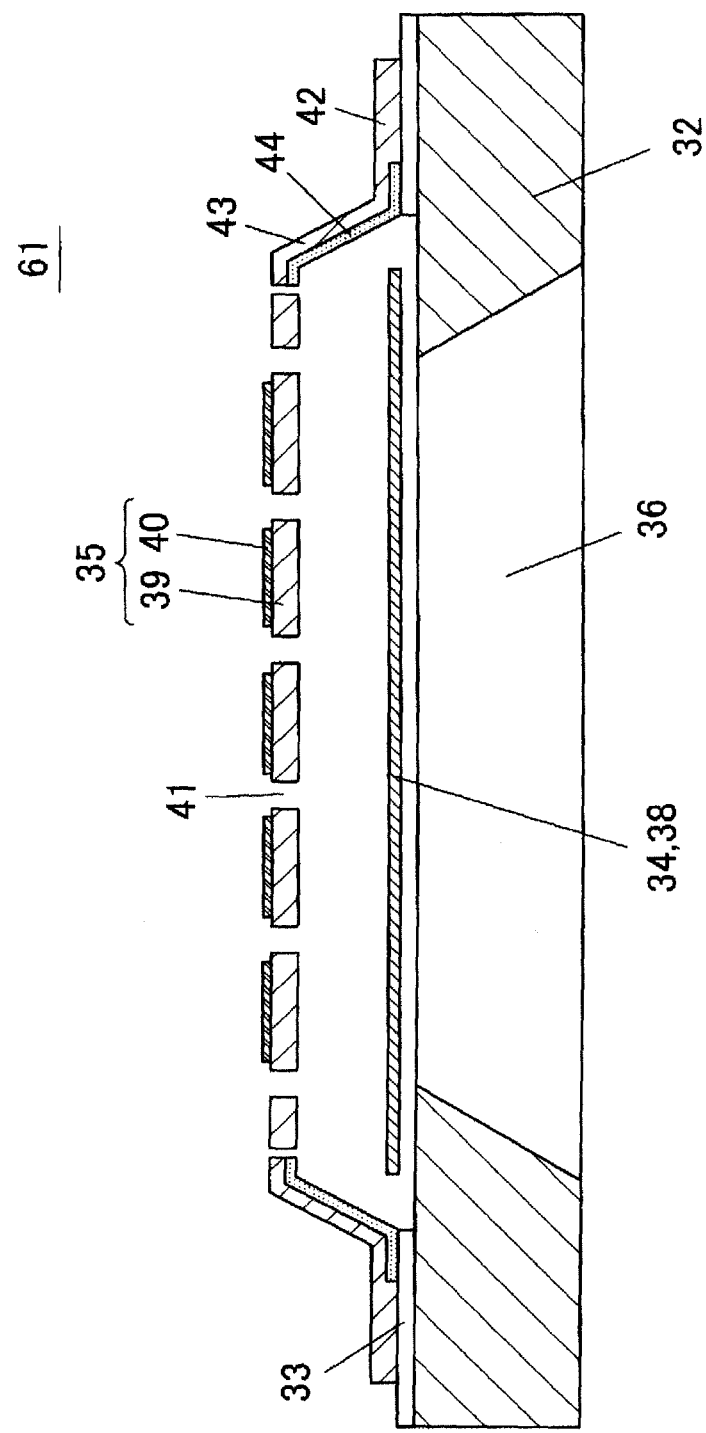
FIG. 13 is a schematic cross-sectional view of the vibration sensor of the third embodiment.

FIG. 12 is a schematic plan view showing a vibration sensor 61 according to a third embodiment of the present invention. FIG. 13 is a schematic cross-sectional view of the vibration sensor 61 of the third embodiment. In this embodiment, the reinforcement film 44 is arranged at the inner surface of the side wall portion 43 of the back plate 39 and the region in the vicinity thereof.

The case of arranging the reinforcement film 44 on the inner surface of the side wall portion 43 is similar to the first embodiment in that the reinforcement film 44 is prevented from touching the electrically conductive region of the fixed electrode plate 35 and the electrically conductive region of the vibration electrode plate 34, and in that the reinforcement film 44 is prevented from overlapping the electrically conductive region of the fixed electrode plate 35 and the electrically conductive region of the vibration electrode plate 34. Because the reinforcement film 44 is arranged in the minimum region, the reinforcement film 44 may be arranged only at the four corners of the inner surface of the side wall portion 43.

FIGS. 14A to 14F are schematic cross-sectional views showing the manufacturing steps of the vibration sensor 61 of the third embodiment. The manufacturing steps are substantially the same as the manufacturing steps of the first embodiment shown in FIG. 10. The difference is that the reinforcement film 44 is formed in advance on the side wall surface of the sacrifice layer 49 in FIG. 14C. After forming the reinforcement film 44, the back plate 39 is formed on the sacrifice layer 49 as shown in FIG. 14D to form the reinforcement film 44 on the inner surface of the side wall portion 43 of the back plate 39.

In the embodiment, the side wall portion 43 can be protected by the reinforcement film 44 when removing the sacrifice layer 49 by etching as shown in FIG. 14F, and hence it is effective when the material of the back plate 39 has a relatively high etching rate with respect to the etchant used in the etching of the sacrifice layer 49.

It should be recognized that the reinforcement film 44 may be arranged on both sides, the inner surface and the outer surface, of the side wall portion 43.

31, 51, 61 vibration sensor
32 silicon substrate
34 vibration electrode plate
35 fixed electrode plate
37 supporting leg
38 diaphragm
39 back plate
40 fixed electrode
41 acoustic perforation
42 fixed part
43 side wall portion
44 reinforcement film
45 drawing portion
46 electrode pad
47 extended part
48 electrode pad
49 sacrifice layer While the invention has been described with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

The invention claimed is:

1. A capacitive sensor comprising:
a substrate;
a movable electrode plate arranged on an upper surface of the substrate; and
a fixed electrode plate arranged on the upper surface of the substrate so as to cover the movable electrode plate,
wherein a physical amount or change thereof is detected by a capacitance or a change thereof between the movable electrode plate and the fixed electrode plate,
wherein the fixed electrode plate has a portion facing the upper surface of the substrate through a space, wherein the space is supported by a side wall portion arranged on an inner edge of a portion fixed to the upper surface of the substrate without interposing the space, wherein the fixed electrode plate comprises an outer peripheral part disposed at an outer periphery thereof, wherein the outer peripheral part comprises an inner peripheral edge and an outer peripheral edge, wherein a reinforcement film is formed on at least one part of the side wall portion along the inner peripheral edge of the outer peripheral part of the fixed electrode plate, wherein the reinforcement film is made of metal, wherein the reinforcement film is electrically insulated with both the movable electrode plate and the fixed electrode plate, and wherein the reinforcement film does not overlap an electrically conductive region of the movable electrode plate and an electrically conductive region of the fixed electrode plate.

2. The capacitive sensor according to claim 1, wherein the reinforcement film is formed by at least one material selected from Au, Cr, and Pt.

3. The capacitive sensor according to claim 1, wherein the reinforcement film is arranged on an outer surface of the side wall portion.

4. The capacitive sensor according to claim 1, wherein the reinforcement film is arranged on an inner surface of the side wall portion.

5. The capacitive sensor according to claim 1, wherein the reinforcement film is formed entirely excluding a region for insulation adjacent to the region that does not overlap either the electrically conductive region of the movable electrode plate and the electrically conductive region of the fixed electrode plate on at least one of an outer surface and an inner surface of the side wall portion.

6. The capacitive sensor according to claim 1, wherein the outer peripheral part is on an outer side of a region facing a diaphragm.

7. A capacitive sensor comprising:

a substrate;

a movable electrode plate disposed on the substrate; and a fixed electrode plate that is disposed on the substrate by fixing a fixed portion of the fixed electrode plate to the substrate, and that covers the movable electrode plate, wherein a physical amount or change thereof is detected by a capacitance or a change thereof between the movable electrode plate and the fixed electrode plate, wherein the fixed electrode plate is spaced apart from the substrate to form a space, wherein the space is formed between side wall portions, wherein the side wall portions are arranged on an inner edge of the fixed portion, wherein the fixed portion comprises an inner peripheral edge and an outer peripheral edge, wherein a reinforcement film is formed on at least one part of the side wall portion along the inner peripheral edge of the fixed portion, wherein the reinforcement film is made of metal, and wherein the reinforcement film is electrically insulated from the movable electrode plate and the fixed electrode plate.

8. The capacitive sensor according to claim 1, wherein the reinforcement film is formed by at least one material selected from Au, Cr, and Pt.

9. The capacitive sensor according to claim 1, wherein the reinforcement film does not overlap an electrically conductive region of the movable electrode plate and an electrically conductive region of the fixed electrode plate.

10. The capacitive sensor according to claim 1, wherein the reinforcement film is arranged on an outer surface of the side wall portion.

11. The capacitive sensor according to claim 1, wherein the reinforcement film is arranged on an inner surface of the side wall portion.

12. The capacitive sensor according to claim 1, wherein the reinforcement film is formed entirely excluding a region for insulation adjacent to the region that does not overlap either the electrically conductive region of the movable electrode plate and the electrically conductive region of the fixed electrode plate on at least one of an outer surface and an inner surface of the side wall portion.

13. The capacitive sensor according to claim 1, wherein the outer peripheral part is on an outer side of a region facing a diaphragm.

* * * * *